(12) United States Patent
Kim et al.

(10) Patent No.: US 7,521,848 B2
(45) Date of Patent: Apr. 21, 2009

(54) PLASMA DISPLAY APPARATUS

(75) Inventors: Ki-Jung Kim, Suwon-si (KR); Kyoung-Ho Kang, Suwon-si (KR)

(73) Assignee: Samsung SDI Co., Ltd., Suwon (KR)

( * ) Notice: Subject to any disclaimer, the term of this patent is extended or adjusted under 35 U.S.C. 154(b) by 609 days.

(21) Appl. No.: 11/253,651

(22) Filed: Oct. 20, 2005

(65) Prior Publication Data
US 2006/0087210 A1   Apr. 27, 2006

(30) Foreign Application Priority Data
Oct. 25, 2004 (KR) .................. 10-2004-0085390

(51) Int. Cl.
*H01J 17/49* (2006.01)
(52) U.S. Cl. .................. 313/24; 313/581; 313/582; 313/492; 313/493
(58) Field of Classification Search .................. 313/24, 313/492, 493, 514, 581, 582, 613, 634, 239, 313/326, 352
See application file for complete search history.

(56) References Cited
U.S. PATENT DOCUMENTS 5,990,618 A * 11/1999 Morita et al. .............. 313/582
6,747,408 B2 * 6/2004 Sung et al. ................. 313/582
7,235,922 B2 * 6/2007 Jun et al. ................... 313/582

FOREIGN PATENT DOCUMENTS
CN        1492456      4/2004
JP        2002-061466  2/2002

\* cited by examiner

*Primary Examiner*—Ashok Patel
(74) *Attorney, Agent, or Firm*—H.C. Park & Associates, PLC

(57) ABSTRACT

A plasma display apparatus including a plasma display panel, a chassis base coupled with the plasma display panel, a printed circuit board assembly coupled with the chassis base, a case housing the plasma display panel, the chassis base, and the printed circuit board assembly, and a liquid shielding plate for receiving liquid entering the apparatus.

19 Claims, 5 Drawing Sheets

PLASMA DISPLAY APPARATUS

CROSS-REFERENCE TO RELATED PATENT APPLICATIONS

This application claims priority to and the benefit of Korean Patent Application No. 10-2004-0085390, filed on Oct. 25, 2004, which is hereby incorporated by reference for all purposes as if fully set forth herein.

BACKGROUND OF THE INVENTION

1. Field of the Invention

The present invention relates to a plasma display apparatus, and more particularly, to a plasma display apparatus capable of discharging liquid that enters the apparatus.

2. Discussion of the Background

Generally, a plasma display apparatus is a flat panel display that generates a gas discharge to display images. It is considered a next generation display that may substitute for a cathode ray tube (CRT) since it has excellent display characteristics, such as large screen size, brightness, contrast, and viewing angle. The plasma display apparatus includes a plasma display panel (PDP) formed of glass substrates, and a chassis base supporting the PDP.

FIG. 1 is a schematic cross-sectional view showing a conventional plasma display apparatus.

Referring to FIG. 1, the plasma display apparatus includes a PDP having a front substrate 11 and a rear substrate 12, a chassis base 13 attached on a rear surface of the PDP, and a printed circuit board assembly 16 arranged on a rear surface of the chassis base 13. The PDP, the chassis base 13, and the printed circuit board assembly 16 are housed in a case 17. A filter 19 is arranged on a front surface of the case 17.

The PDP is attached to the chassis base 13 by double sided tape 14, and a thermal conductive sheet 15, which dissipates heat generated by the PDP, is disposed between the PDP and the chassis base 13. A signal transmission cable 18 couples electrodes formed on inner surface of the rear substrate 12 with a circuit of the printed circuit board assembly 16. Additionally, another signal transmission cable (not shown) couples electrodes formed on the front substrate 11 with a circuit formed on the printed circuit board assembly 16.

Referring to FIG. 1, the case 17 may be formed by assembling a front case and a rear case. Ventilation holes 17a are formed on upper and rear surfaces of the case 17 to dissipate heat generated by the PDP and the printed circuit board assembly 16.

In such a plasma display apparatus, if liquid enters the apparatus through the ventilation holes 17a, the liquid is not discharged out of the apparatus. For example, liquid may be spilled into the apparatus or when the apparatus is placed outdoors, rain may enter it. If liquid contacts the printed circuit board assembly 16, the apparatus may be damaged or its performance may be degraded due to signal leakage and short-circuiting.

SUMMARY OF THE INVENTION

The present invention provides a plasma display apparatus that may prevent liquid that enters the apparatus from negatively affecting the apparatus' performance.

Additional features of the invention will be set forth in the description which follows, and in part will be apparent from the description, or may be learned by practice of the invention.

The present invention discloses a plasma display apparatus including a PDP, a chassis base coupled with the PDP, a printed circuit board assembly coupled with the chassis base, a case housing the PDP, the chassis base, and the printed circuit board assembly, and a liquid shielding plate for receiving liquid entering the apparatus.

The present invention also discloses a plasma display apparatus including a PDP, a chassis base coupled with the PDP, a printed circuit board assembly coupled with the chassis base, a case housing the PDP, the chassis base, and the printed circuit board assembly, and an inner wall including a wall portion and a liquid shielding plate. The liquid shielding plate receives liquid entering the apparatus.

The present invention also discloses a flat panel display apparatus including a display panel, a case housing the display panel, and a liquid shielding plate for receiving liquid entering the apparatus.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
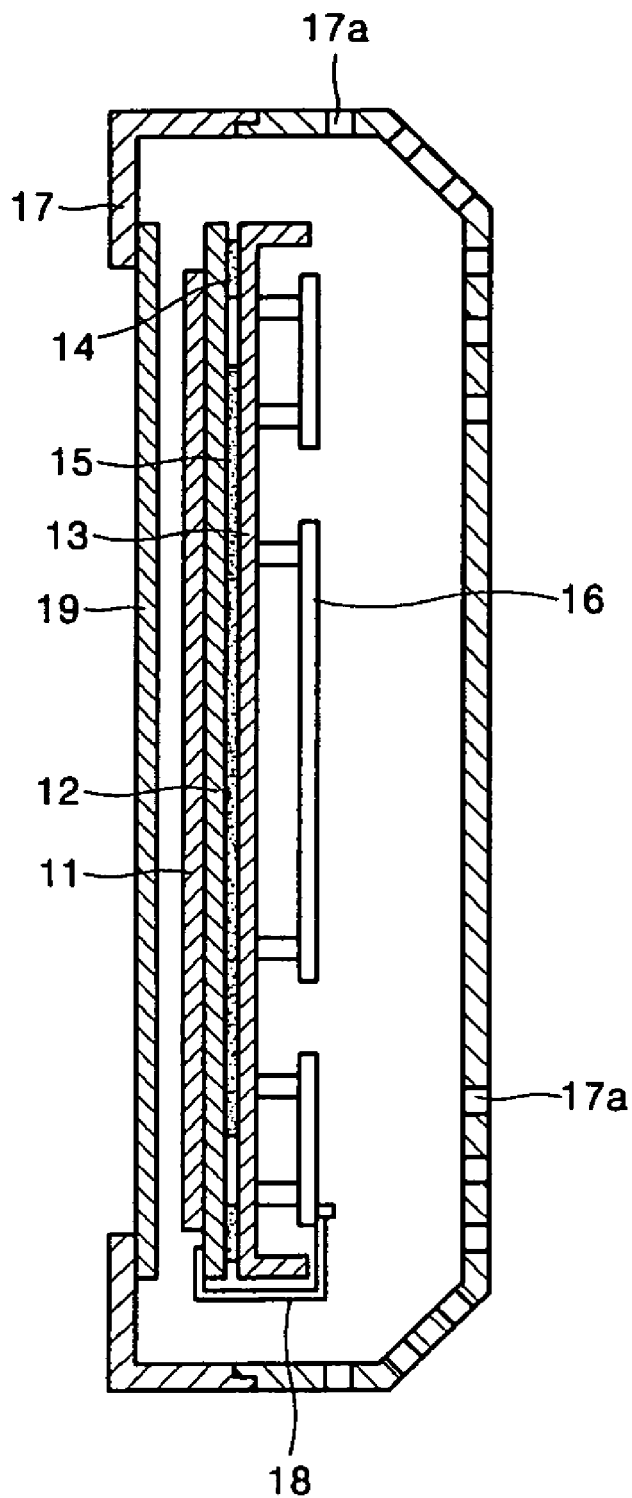
FIG. 1 is a schematic cross-sectional view showing a conventional plasma display apparatus.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals refer to like elements throughout the drawings.

Figure 2:
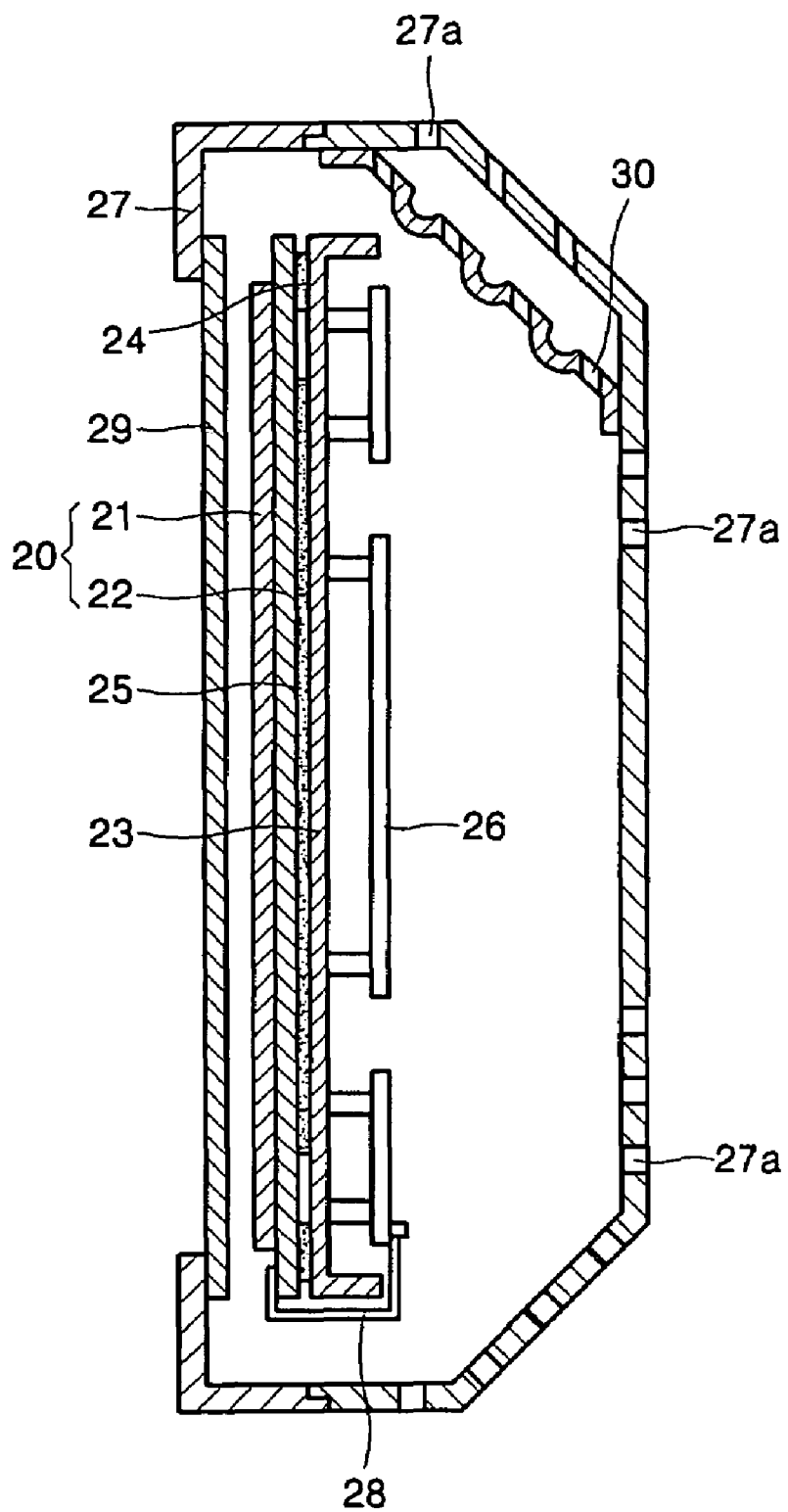
FIG. 2 is a schematic perspective view showing a plasma display apparatus according to an exemplary embodiment of the present invention.

FIG. 2 is a schematic perspective view showing a plasma display apparatus according to an exemplary embodiment of the present invention.

Referring to FIG. 2, the plasma display apparatus includes a plasma display panel (PDP) 20 including a front substrate 21 and a rear substrate 22, a chassis base 23 coupled with a rear surface of the PDP 20, and a printed circuit board assembly 26 installed on the chassis base 23. The PDP 20, the chassis base 23, and the printed circuit board assembly 26 are arranged in a case 27. A filter 29 is arranged on a front portion of the case 27.

The PDP 20 is coupled with the chassis base 23 using double sided tape 24, and a thermal conductive sheet 25 is arranged between the PDP 20 and the chassis base 23. A signal transmission cable 28 couples electrodes formed on the rear substrate 22 with a circuit on the printed circuit board 26. Additionally, another signal transmission cable (not shown) couples electrodes formed on the front substrate 21 with a circuit on the printed circuit board 26.

According to an exemplary embodiment of the present invention, a liquid shielding plate 30 is arranged in the case 27. As shown in FIG. 2, the liquid shielding plate 30 is arranged inside the case 27 and at an upper portion of the case 27. The liquid shielding plate 30 shields the printed circuit board 26 from liquid entering through ventilation holes formed on the upper or rear surface of the case 27. The liquid shielding plate 30 includes ventilation holes and drain recesses, which will be described in more detail below.

Figure 3:
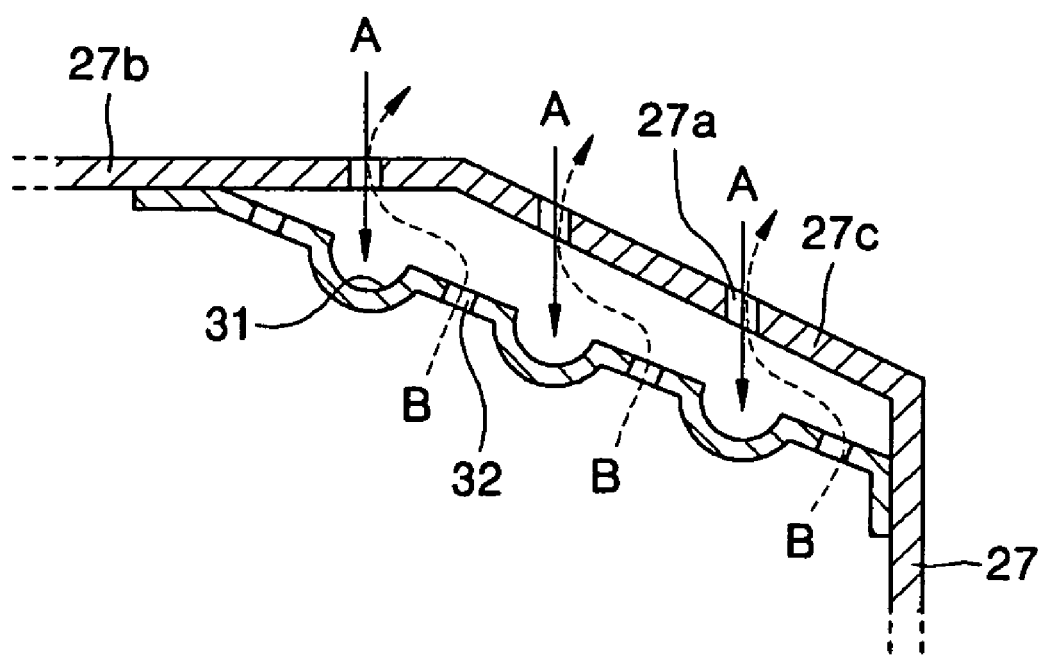
FIG. 3 is a cross-sectional view showing an enlarged part of a liquid shielding plate and a case of FIG. 2.

FIG. 3 is an enlarged cross-sectional view showing a portion of the liquid shielding plate and case of FIG. 2.

Referring to FIG. 3, an upper surface of the case 27 may include a plane surface 27b and a slanted surface 27c, and ventilation holes 27a are formed in the plane surface 27b and the slanted surface 27c. The liquid shielding plate 30 includes one or more drain recesses 31, which perform as waterways for guiding liquid that is caught by the liquid shielding plate 30.

The drain recesses 31 may be arranged directly under the ventilation holes 27a formed on the plane surface 27b and the slanted surface 27c to catch liquid entering the apparatus through the ventilation holes 27a. The drain recesses 31 are slanted in a transverse direction of the case 27 so that liquid guided by the drain recesses 31 flows toward a side of the case 27.

Additionally, ventilation holes 32 are formed in the liquid shielding plate 30 between the one or more drain recesses 31. The ventilation holes 32 are alternately arranged with the ventilation holes 27a formed on the case 27. That is, the ventilation holes 32 of the liquid shielding plate 30 are not formed directly under the ventilation holes 27a of the case 27. Therefore, liquid entering the ventilation holes 27a may not enter the apparatus through the ventilation holes 32 of the liquid shielding plate 30, which are formed to dissipate heat generated during operation.

Referring to FIG. 3, liquid A entering the ventilation holes 27a is guided through a predetermined path by the drain recesses 31, and heat B inside the apparatus may be dissipated out of the apparatus through the ventilation holes 32 and 27a.

Figure 4:
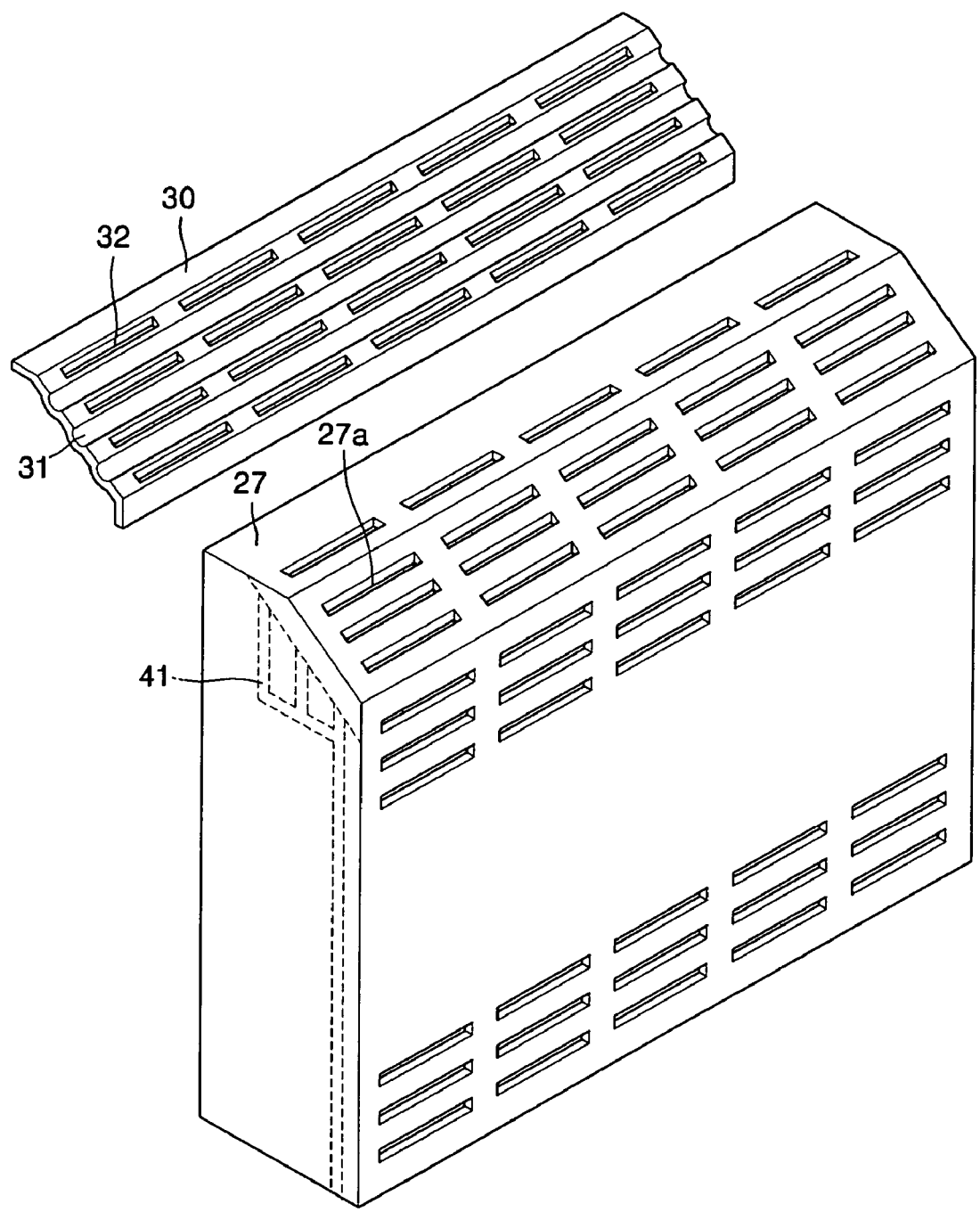
FIG. 4 is a schematic perspective view showing a part of the liquid shielding plate and the case of FIG. 2 and FIG. 3.

FIG. 4 is a schematic perspective view showing a part of the liquid shielding plate and the case of FIG. 2 and FIG. 3.

Referring to FIG. 4, the liquid shielding plate 30 extends in the transverse direction of the case 27, and it includes one or more drain recesses 31. The ventilation holes 32 are arranged between the drain recesses 31. The drain recesses 31 extend in the transverse direction of the case 27, and both ends of the drain recesses 31 may be coupled with waterways 41 formed inside of the side surface of the case 27. The drain recesses 31 may be slanted so that liquid flowing along the drain recesses 31 may flow toward the waterways 41 at both ends of the drain recesses 31. In this case, the liquid shielding plate 30 may be designed to be highest at its center portion and to gradually lower toward both ends. Alternatively, the shielding plate 30 may be highest at the left or right side of the case 27, and it may gradually lower as it proceeds toward the other side of the case 27.

The waterway 41 installed on an inner side surface of the case 27 may be formed in various shapes. For example, recesses extending in a vertical direction of the case 27 may be formed on the inner side surfaces of the case 27, and covers may be formed on the recesses. Additionally, the waterway 41 may be formed as slanted recesses without covers so that liquid may flow downward along the waterway 41. The waterway 41 may be formed in any shape, provided it is coupled with the drain recesses 31 of the liquid shielding plate 30 to guide the liquid.

Figure 5:
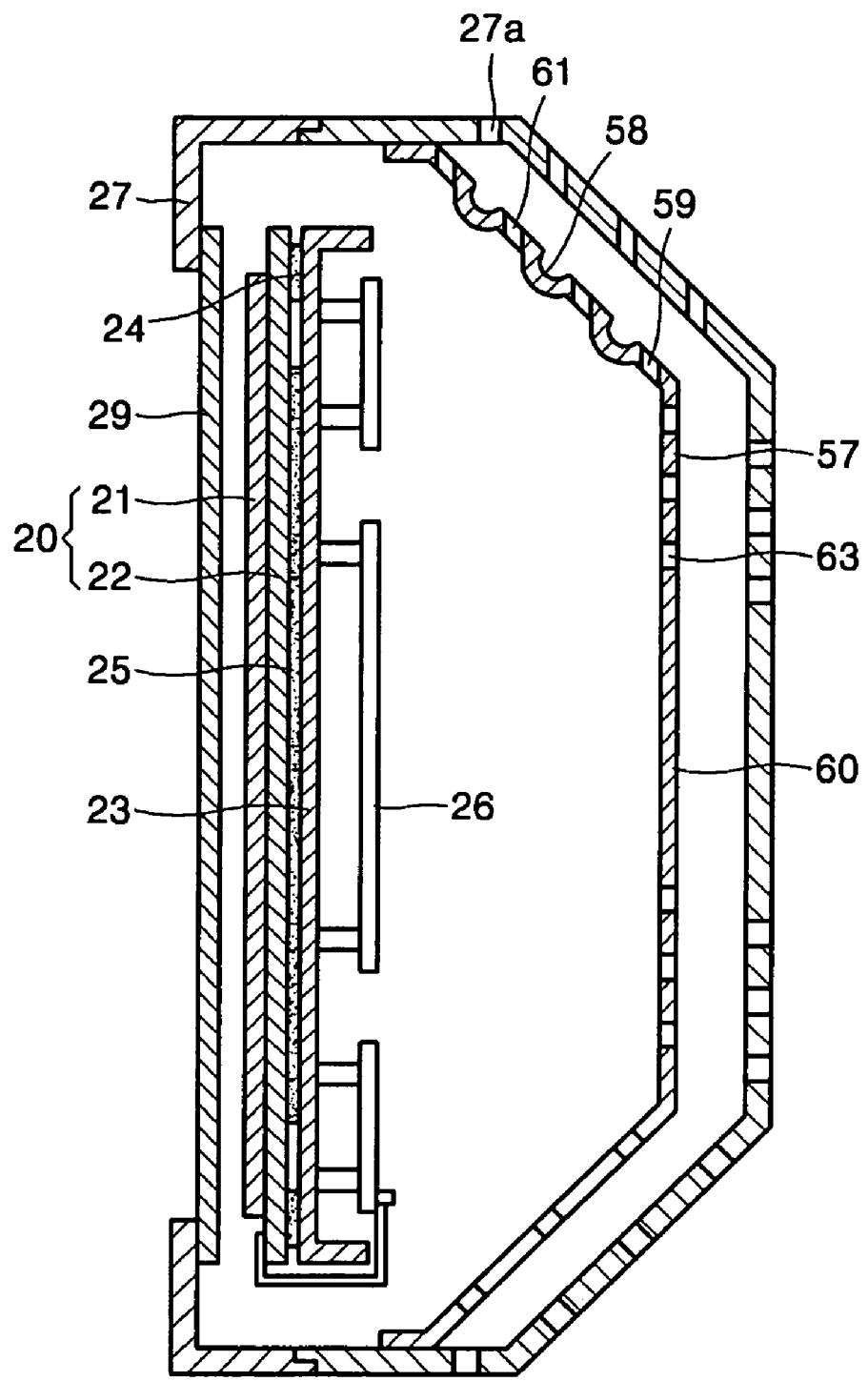
FIG. 5 is a schematic cross-sectional view showing a plasma display apparatus according to another exemplary embodiment of the present invention.

FIG. 5 is a schematic cross-sectional view of a plasma display apparatus according to another exemplary embodiment of the present invention.

Referring to FIG. 5, the PDP 20, the chassis base 23, and the printed circuit board 26 are arranged in the case 27 like the above embodiment, and detailed descriptions for those are omitted.

According to the present embodiment, an inner wall 60 is integrally formed with the liquid shielding plate 61 and is arranged in the case 27. The inner wall 60 is arranged to correspond to the rear surface of the case 27, and it includes the liquid shielding plate described with reference to FIG. 2 and FIG. 3 at the upper portion thereof, and has a wall portion 57 extending from the liquid shielding plate 61. The vertical and slanted walls of the inner wall 60 correspond to the cross section of the rear surface of the case 27 and are separated from the rear surface of the case 27. Therefore, if the case 27 is formed with another shape, the portions of the inner wall 60 extending from the liquid shielding plate 61 may be formed differently.

The liquid shielding plate 61 of the inner wall 60 includes drain recesses 58 and ventilation holes 59 formed between the drain recesses 58. The drain recesses 58 are arranged directly under the ventilation holes 27a of the case 27, and the ventilation holes 59 are alternately arranged with the ventilation holes 27a of the case 27. Additionally, ventilation holes 63 formed in the vertical and slanted walls extending from the liquid shielding plate 61 are alternately arranged with the ventilation holes 27a formed in the case 27.

According to exemplary embodiments of the present invention, liquid entering the apparatus may not damage the apparatus' circuits. Therefore, the plasma display apparatus may be installed at some outdoor locations, and inadvertent spills may be dealt with.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A plasma display apparatus, comprising:
    a plasma display panel;
    a chassis base coupled with the plasma display panel;
    a printed circuit board assembly coupled with the chassis base;
    a case housing the plasma display panel, the chassis base, and the printed circuit board assembly; and
    a liquid shielding plate for receiving liquid entering the apparatus.

2. The plasma display apparatus of claim 1, wherein the liquid shielding plate is arranged in the case to correspond to ventilation holes in the case, and
    wherein the liquid shielding plate comprises one or more drain recesses extending in a transverse direction of the case and a plurality of ventilation holes arranged between the one or more drain recesses.

3. The plasma display apparatus of claim 2, wherein the one or more drain recesses of the liquid shielding plate are arranged directly under the ventilation holes of the case, and the ventilation holes of the liquid shielding plate are alternately arranged with the ventilation holes of the case.

4. The plasma display apparatus of claim 2, further comprising:
   a waterway for receiving liquid flowing along the one or more drain recesses,
   wherein the waterway is coupled with an end portion of the one or more drain recesses.

5. The plasma display apparatus of claim 4, wherein the waterway is arranged on a side wall of the case.

6. The plasma display apparatus of claim 2, wherein the one or more drain recesses are slanted.

7. The plasma display apparatus of claim 6, wherein the one or more drain recesses slant downward from a first end to a second end.

8. The plasma display apparatus of claim 6, wherein the one or more drain recesses have a highest point at a center portion and slant downward towards each end.

9. A plasma display apparatus, comprising:
   a plasma display panel;
   a chassis base coupled with the plasma display panel;
   a printed circuit board assembly coupled with the chassis base;
   a case housing the plasma display panel, the chassis base, and the printed circuit board assembly;
   an inner wall including a wall portion and a liquid shielding plate,
   wherein the liquid shielding plate receives liquid entering the apparatus.

10. The plasma display apparatus of claim 9, wherein the liquid shielding plate is arranged in the case to correspond to ventilation holes in the case, and includes one or more drain recesses extending in a transverse direction of the case and a plurality of ventilation holes arranged between the one or more drain recesses, and
    wherein the wall portion extends from the liquid shielding plate and is spaced apart from a rear surface the case.

11. The plasma display apparatus of claim 10, wherein the one or more drain recesses of the liquid shielding plate are arranged directly under the ventilation holes of the case, and the ventilation holes of the liquid shielding plate are alternately arranged with the ventilation holes of the case.

12. The plasma display apparatus of claim 10, further comprising:
    a waterway for receiving liquid flowing along the one or more drain recesses,
    wherein the waterway is coupled with an end portion of the one or more drain recesses.

13. The plasma display apparatus of claim 12, wherein the waterway is arranged on a side wall of the case.

14. The plasma display apparatus of claim 10, wherein the one or more drain recesses are slanted.

15. The plasma display apparatus of claim 14, wherein the one or more drain recesses slant downward from a first end to a second end.

16. The plasma display apparatus of claim 14, wherein the one or more drain recesses have a highest point at a center portion and slant downward towards each end.

17. The plasma display apparatus of claim 10, wherein the wall portion corresponds to the rear surface of the case.

18. A flat panel display apparatus, comprising:
    a display panel;
    a case housing the display panel; and
    a liquid shielding plate for receiving liquid entering the apparatus,
    wherein the liquid shielding plate is arranged in the case to correspond to ventilation holes in the case, and
    wherein the shielding plate comprises one or more drain recesses extending in a transverse direction of the case and a plurality of ventilation holes arranged between the one or more drain recesses.

19. The flat panel display apparatus of claim 18, further comprising:
    a waterway for receiving liquid flowing along the one or more drain recesses,
    wherein the waterway is coupled with an end portion of the one or more drain recesses,
    wherein the one or more drain recesses of the liquid shielding plate are arranged directly under the ventilation holes of the case, and the ventilation holes of the liquid shielding plate are alternately arranged with the ventilation holes of the case, and
    wherein the display panel is a plasma display panel.

* * * * *